United States Patent
Takahashi et al.

(10) Patent No.: US 12,490,375 B2
(45) Date of Patent: Dec. 2, 2025

(54) PRINTED WIRING BOARD

(71) Applicant: SUMITOMO ELECTRIC INDUSTRIES, LTD., Osaka (JP)

(72) Inventors: Kenji Takahashi, Osaka (JP); Shoichiro Sakai, Osaka (JP); Kou Noguchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 18/038,009

(22) PCT Filed: Jun. 22, 2022

(86) PCT No.: PCT/JP2022/024890
§ 371 (c)(1),
(2) Date: May 20, 2023

(87) PCT Pub. No.: WO2023/276818
PCT Pub. Date: Jan. 5, 2023

(65) Prior Publication Data
US 2023/0422407 A1 Dec. 28, 2023

(30) Foreign Application Priority Data

Jun. 28, 2021 (JP) ................................. 2021-106969

(51) Int. Cl.
*H05K 1/02* (2006.01)
*H01F 17/00* (2006.01)
(Continued)

(52) U.S. Cl.
CPC ....... *H05K 1/0298* (2013.01); *H01F 17/0013* (2013.01); *H05K 1/165* (2013.01); *H01F 27/2804* (2013.01); *H05K 2201/0959* (2013.01)

(58) Field of Classification Search
CPC ... H01F 17/0013; H01F 1/165; H01F 27/2804
See application file for complete search history.

(56) References Cited

U.S. PATENT DOCUMENTS

| | | | | |
|---|---|---|---|---|
| 4,959,631 A | * | 9/1990 | Hasegawa | H01F 17/0006 336/200 |
| 5,515,022 A | * | 5/1996 | Tashiro | H01F 17/0013 336/200 |

(Continued)

FOREIGN PATENT DOCUMENTS

| | | |
|---|---|---|
| JP | 2009-246363 A | 10/2009 |
| JP | 2016-9854 A | 1/2016 |

(Continued)

OTHER PUBLICATIONS

English Translation WO2018211733; Sumitomo Electric Printed Circuits; Miura et al. Published Nov. 22, 2018 (Year: 2018).*

*Primary Examiner* — Steven T Sawyer
(74) *Attorney, Agent, or Firm* — Renner, Otto, Boisselle & Sklar, LLP

(57) ABSTRACT

A printed wiring board includes: a base film having a main surface; a wiring disposed on the main surface; a first plating lead connected to a first position of the wiring; and a second plating lead connected to a second position of the wiring. A cross sectional area of the wiring at a third position of the wiring is 95% or more of a cross sectional area of the wiring at the first position, the third position being an intermediate position between the first position and the second position.

2 Claims, 9 Drawing Sheets

(51) Int. Cl.
*H05K 1/16* (2006.01)
*H01F 27/28* (2006.01)

(56) References Cited

U.S. PATENT DOCUMENTS

| | | | | |
|---|---|---|---|---|
| 2016/0094082 | A1* | 3/2016 | Ookawa | H01M 10/425 |
| | | | | 320/108 |
| 2018/0174748 | A1* | 6/2018 | Horikawa | G06K 19/07783 |
| 2018/0374623 | A1* | 12/2018 | Ito | H01F 27/2804 |
| 2019/0057800 | A1* | 2/2019 | Ito | H01F 17/0013 |
| 2019/0057803 | A1* | 2/2019 | Muraoka | H01F 41/041 |
| 2020/0022262 | A1 | 1/2020 | Okamoto et al. | |

FOREIGN PATENT DOCUMENTS

| | | |
|---|---|---|
| JP | 2018-98415 A | 6/2018 |
| WO | 2017/199747 A1 | 11/2017 |
| WO | 2018/211733 A1 | 11/2018 |

\* cited by examiner

PRINTED WIRING BOARD

TECHNICAL FIELD

The present disclosure relates to a printed wiring board. The present application claims priority based on Japanese Patent Application No. 2021-106969 filed on Jun. 28, 2021, the entire content of which is incorporated herein by reference.

BACKGROUND ART

For example, Japanese Patent Laying-Open No. 2016-9854 (PTL 1) describes a printed wiring board. The printed wiring board described in PTL 1 has a base film and a wiring disposed on a main surface of the base film. The wiring has a seed layer disposed on the main surface of the base film, a core disposed on the seed layer, and a shrink layer covering the core.

CITATION LIST

Patent Literature

PTL 1: Japanese Patent Laying-Open No. 2016-9854

SUMMARY OF INVENTION

A printed wiring board of the present disclosure includes: a base film having a main surface; a wiring disposed on the main surface; a first plating lead connected to a first position of the wiring; and a second plating lead connected to a second position of the wiring. A cross sectional area of the wiring at a third position of the wiring is 95% or more of a cross sectional area of the wiring at the first position, the third position being an intermediate position between the first position and the second position.

DETAILED DESCRIPTION

Figure 1:
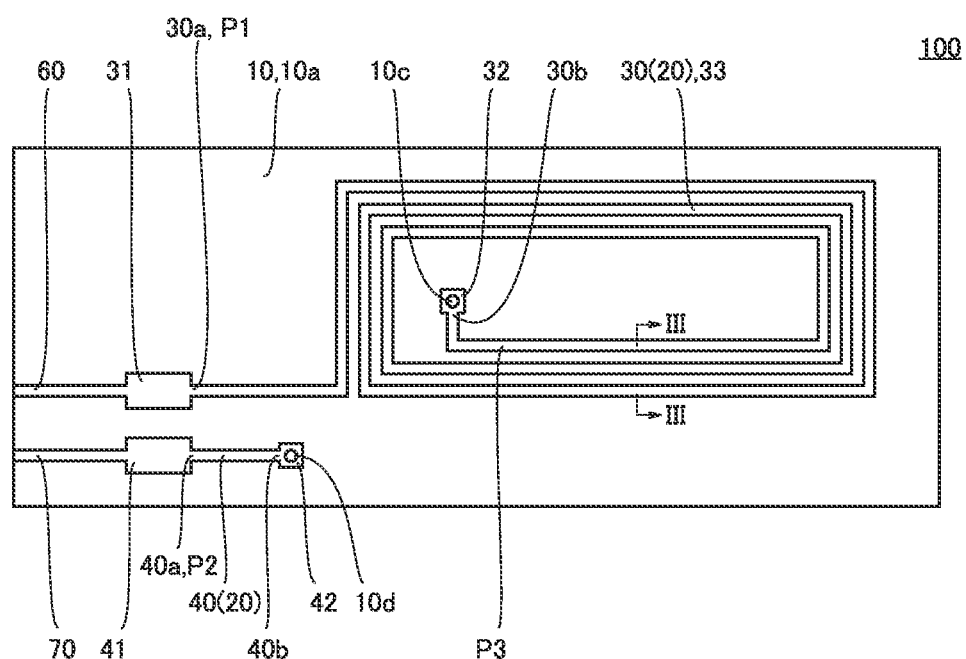
FIG. 1 is a plan view of a printed wiring board 100.

Problems to be Solved by the Present Disclosure

In the formation of the wiring of the printed wiring board described in PTL 1, first, the seed layer is formed on the main surface of the base film. Second, a resist provided with an opening is formed on the seed layer. Third, electroplating (first electroplating) is performed onto the seed layer exposed from the opening of the resist by feeding current to the seed layer. In this way, the core is formed. Third, the seed layer existing between the resist and the core is removed and current is fed to the core, thereby performing electroplating (second electroplating) to cover the core. In this way, the shrink layer is formed.

In the second electroplating step, a voltage applied to a portion of the core away from the current feeding position is lower than a voltage applied to a portion of the core close to the current feeding position. Therefore, the thickness of the shrink layer is small at a portion of the wiring away from the current feeding position. In other words, a cross sectional area of the portion of the wiring away from the current feeding position is small to result in an increased electric resistance value.

The present disclosure has been made in view of the above-described problem of the conventional art. More specifically, the present disclosure provides a printed wiring board in which a difference is small between a cross sectional area of a portion of a wiring close to a current feeding position and a cross sectional area of a portion of the wiring away from the current feeding position.

Advantageous Effect of the Present Disclosure

According to the printed wiring board of the present disclosure, the difference can be small between the cross sectional area of the portion of the wiring close to the current feeding position and the cross sectional area of the portion of the wiring away from the current feeding position.

DESCRIPTION OF EMBODIMENTS

First, embodiments of the present disclosure will be listed and described.

(1) A printed wiring board according to an embodiment includes: a base film having a main surface; a wiring disposed on the main surface; a first plating lead connected to a first position of the wiring; and a second plating lead connected to a second position of the wiring. A cross sectional area of the wiring at a third position of the wiring is 95% or more of a cross sectional area of the wiring at the first position, the third position being an intermediate position between the first position and the second position.

According to the printed wiring board of (1), a difference can be small between a cross sectional area of a portion of the wiring close to a current feeding position and a cross sectional area of a portion of the wiring away from the current feeding position.

(2) In the printed wiring board of (1), the wiring may have a seed layer disposed on the main surface, a first electroplating layer disposed on the seed layer, and a second electroplating layer covering the seed layer and the first electroplating layer. A thickness of the second electroplating layer at the third position may be 8 μm or less.

(3) In the printed wiring board of (1) or (2), an electric resistance value of the first plating lead between the first position and an end of the first plating lead opposite to the wiring may be 1Ω or less, and an electric resistance value of the wiring and the first plating lead between the third position and the end of the first plating lead opposite to the wiring may be 5Ω or more and 6Ω or less.

(4) In the printed wiring board of (1) to (3), the wiring may have at least one coil formed by winding the wiring in a form of a spiral on the main surface.

(5) In the printed wiring board of (1) to (4), each of an end of the first plating lead opposite to the wiring and an end of the second plating lead opposite to the wiring may reach an end of the base film.

DETAILS OF EMBODIMENTS OF THE PRESENT DISCLOSURE

Next, details of the embodiments of the present disclosure will be described with reference to figures. In the figures described below, the same or corresponding portions are denoted by the same reference characters, and the same explanation will not be described repeatedly.

Configuration of Printed Wiring Board According to Embodiment

The following describes a configuration of a printed wiring board (hereinafter referred to as "printed wiring board 100") according to an embodiment.

Figure 2:
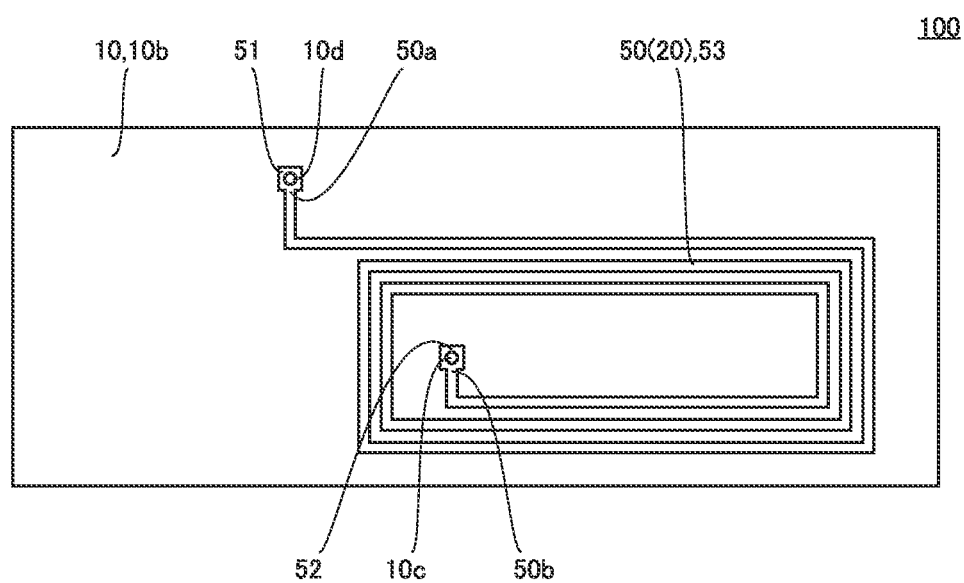
FIG. 2 is a bottom view of printed wiring board 100.
Figure 3:
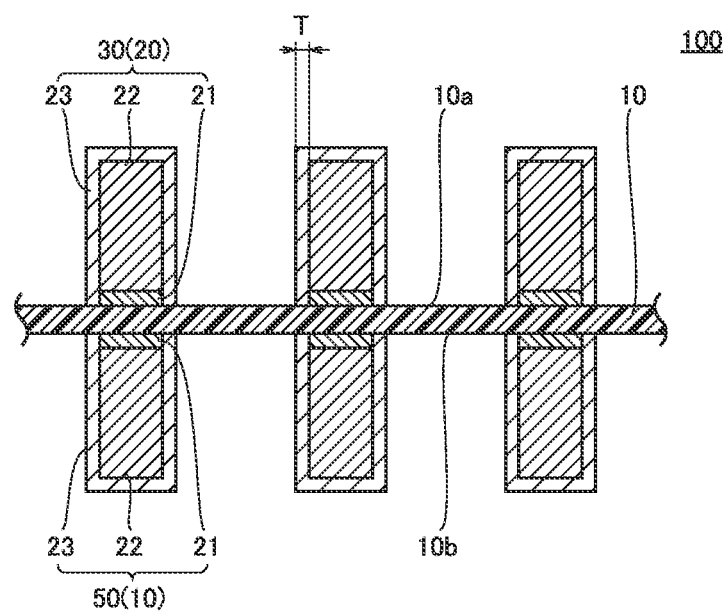
FIG. 3 is a cross sectional view at III-III in FIG. 1.

FIG. 1 is a plan view of printed wiring board 100. FIG. 2 is a bottom view of printed wiring board 100. FIG. 3 is a cross sectional view at III-III in FIG. 1. As shown in FIGS. 1, 2, and 3, printed wiring board 100 has a base film 10, wirings 20, a first plating lead 60, and a second plating lead 70.

Base film 10 is composed of an insulative material having flexibility. That is, printed wiring board 100 is a flexible printed wiring board. Specific examples of the material of base film 10 include polyimide, polyethylene terephthalate, and a fluororesin.

Main surfaces of base film 10 are a first main surface 10a and a second main surface 10b. Second main surface 10b is opposite to first main surface 10a. A direction from first main surface 10a toward second main surface 10b may be referred to as a thickness direction of base film 10.

Wirings 20 are disposed on the main surfaces of base film 10. Wirings 20 have, for example, a first wiring 30, a second wiring 40, and a third wiring 50. First wiring 30 and second wiring 40 are disposed on first main surface 10a. Third wiring 50 is disposed on second main surface 10b.

First wiring 30 has a first end 30a and a second end 30b. Second end 30b is opposite to first end 30a. First wiring 30 is provided with a terminal 31 and a land 32. Terminal 31 is provided on the first end 30a side of first wiring 30. Land 32 is provided on the second end 30b side of first wiring 30.

First wiring 30 has a coil 33. Coil 33 is formed by winding first wiring 30 in the form of a spiral on first main surface 10a. First end 30a is located outside coil 33 when viewed in a plan view (when viewed in a direction orthogonal to first main surface 10a). Second end 30b is located inside coil 33 when viewed in a plan view.

Second wiring 40 has a first end 40a and a second end 40b. Second end 40b is opposite to first end 40a. Second wiring 40 is provided with a terminal 41 and a land 42. Terminal 41 is provided on the first end 40a side of second wiring 40. Land 42 is provided on the second end 40b side of second wiring 40.

Third wiring 50 has a first end 50a and a second end 50b. Second end 50b is opposite to first end 50a. Third wiring 50 is provided with a land 51 and a land 52. Land 51 is provided on the first end 50a side of third wiring 50. Land 52 is provided on the second end 50b side of third wiring 50.

Third wiring 50 has a coil 53. Coil 53 is formed by winding third wiring 50 in the form of a spiral on second main surface 10b. First end 50a is located outside coil 53 when viewed in a plan view (when viewed in a direction orthogonal to second main surface 10b). Second end 50b is located inside coil 53 when viewed in a plan view. Coil 53 overlaps with coil 33 in the thickness direction of base film 10.

A through hole 10c and a through hole 10d are formed in base film 10. Each of through hole 10c and through hole 10d extends through base film 10 along the thickness direction. Through hole 10c overlaps with land 32 and land 52 when viewed in a plan view. Through hole 10d overlaps with land 42 and land 51 when viewed in a plan view.

Land 32 and land 52 are electrically connected together by a conductor (not shown) disposed on an inner wall surface of through hole 10c. Land 42 and land 51 are electrically connected together by a conductor (not shown) disposed on an inner wall surface of through hole 10d. Thus, first wiring 30, second wiring 40, and third wiring 50 are integrated as a wiring disposed on base film 10.

Each of wirings 20 (first wiring 30, second wiring 40, and third wiring 50) has a seed layer 21, a first electroplating layer 22, and a second electroplating layer 23.

Seed layer 21 is disposed on each of the main surfaces (first main surface 10a and second main surface 10b) of base film 10. Seed layer 21 has, for example, a first layer and a second layer. The first layer of seed layer 21 is disposed on each of the main surfaces (first main surface 10a and second main surface 10b) of base film 10. The second layer of seed layer 21 is disposed on the first layer of seed layer 21.

The first layer of seed layer 21 is, for example, a sputtering layer (layer formed by sputtering). Seed layer 21 is composed of, for example, a nickel-chromium alloy. The second layer of seed layer 21 is, for example, an electroless plating layer (layer formed by electroless plating). The second layer of seed layer 21 is composed of copper, for example.

First electroplating layer 22 is a layer formed by electroplating, First electroplating layer 22 is composed of copper, for example. That is, first electroplating layer 22 is composed of the same material as that of the second layer of seed layer 21. First electroplating layer 22 is disposed on seed layer 21.

Second electroplating layer 23 is a layer formed by electroplating. Second electroplating layer 23 is composed of copper, for example. Second electroplating layer 23 covers seed layer 21 and first electroplating layer 22. More specifically, second electroplating layer 23 is disposed on the side surfaces of seed layer 21 and first electroplating layer 22 and the upper surface of first electroplating layer 22. The thickness of second electroplating layer 23 is defined as a thickness T.

First plating lead 60 is connected to a first position P1 of wiring 20. More specifically, first plating lead 60 is connected to first wiring 30. First position P1 is located on the first end 30a side, for example. First plating lead 60 is connected to the first end 30a side of first wiring 30 through terminal 31. An end of first plating lead 60 opposite to wiring 20 (first wiring 30) reaches an end of base film 10. First plating lead 60 is disposed on first main surface 10a.

Second plating lead 70 is connected to second position P2 of wiring 20. More specifically, second plating lead 70 is connected to second wiring 40. Second position P2 is located on the first end 40a side, for example. Second plating lead 70 is connected to the first end 40a side of second wiring 40 through terminal 41. An end of second plating lead 70 opposite to wiring 20 (second wiring 40) reaches an end of base film 10. Second plating lead 70 is disposed on first main surface 10a.

It should be noted that although not shown, each of first plating lead 60 and second plating lead 70 has the same structure as that of each of wirings 20 (first wiring 30, second wiring 40, and third wiring 50). That is, each of first plating lead 60 and second plating lead 70 has seed layer 21, first electroplating layer 22, and second electroplating layer 23.

A position of wiring 20, which is an intermediate position between first position P1 and second position P2, is referred to as a third position P3. Third position P3 is away from a current feeding position with respect to first position P1 and second position P2. From another viewpoint, it can be said that first position P1 and second position P2 are close to the current feeding position with respect to the third position. An electric resistance value of first plating lead 60 between first position P1 and the end of first plating lead 60 opposite to wiring 20 is, for example, 1Ω or less. An electric resistance value of wiring 20 and first plating lead 60 between third position P3 and the end of first plating lead 60 opposite to wiring 20 is, for example, 5Ω or more and 6Ω or less. Each of the electric resistance value of wiring 20 and the electric resistance value of first plating lead 60 is measured by bringing a probe of a tester into contact with a target portion for the measurement.

A cross sectional area of wiring 20 at third position P3 is 95% or more of a cross sectional area of wiring 20 at first position P1. That is, a value obtained by subtracting the cross sectional area of wiring 20 at third position P3 from the cross sectional area of wiring 20 at first position P1 is 5% or less of the cross sectional area of wiring 20 at first position P1. It should be noted that the cross sectional area of wiring 20 at third position P3 is 100% or less of the cross sectional area of wiring 20 at first position P1. The cross sectional area of wiring 20 is measured by the following method. First, at the measurement position, an image of a cross section orthogonal to a length direction of wiring 20 is Obtained. This image is obtained using a microscope. This cross section is exposed using a cross section processing apparatus such as a microtome. Second, the cross sectional area of wiring 20 is calculated based on the obtained image of the cross section of wiring 20.

Thickness T at third position P3 is preferably 8 μm or less. Third position P3 is located at first wiring 30, for example.

Method of Manufacturing Printed Wiring Board 100 According to Embodiment

The following describes a method of manufacturing printed wiring board 100.

Figure 4:
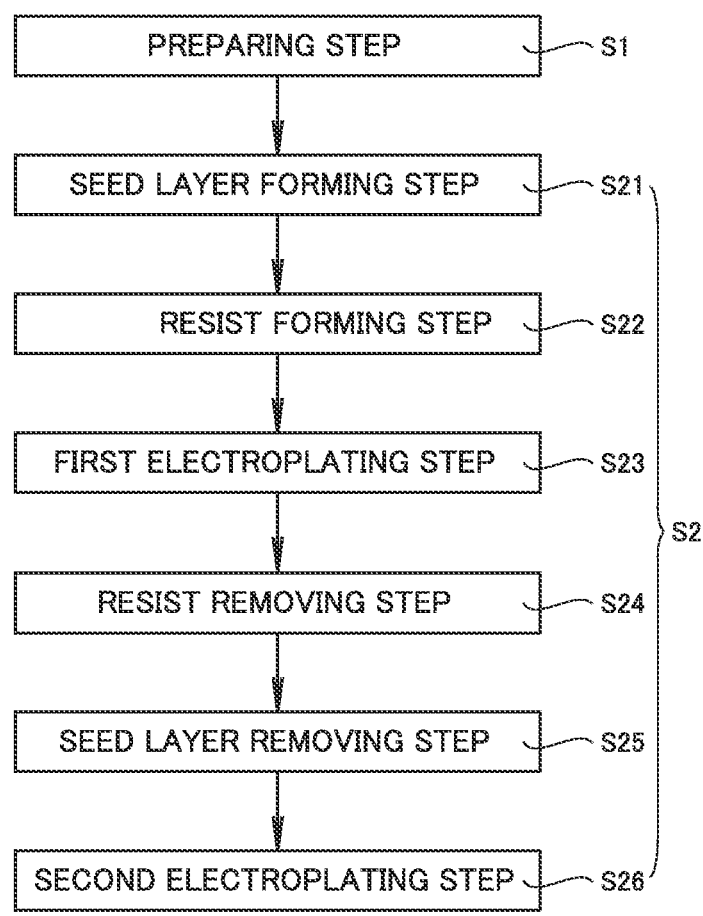
FIG. 4 is a flowchart showing a method of manufacturing printed wiring board 100.

FIG. 4 is a flowchart showing the method of manufacturing printed wiring board 100. As shown in FIG. 4, the method of manufacturing printed wiring board 100 has a preparing step S1 and a wiring forming step S2. Wiring forming step S2 is performed after preparing step S1.

In preparing step S1, base film 10 is prepared. On the base film prepared in preparing step S1, first wiring 30, second wiring 40, first plating lead 60 and second plating lead 70 are not formed on first main surface 10a, and third wiring 50 is not formed on second main surface 10b. The base film prepared in preparing step S1 is not cut into individual pieces.

In wiring forming step S2, wirings 20 are formed. Further, in wiring forming step S2, first plating lead 60 and second plating lead 70 are formed. Wiring forming step S2 is performed using a semi-additive method.

More specifically, wiring forming step S2 has a seed layer forming step S21, a resist forming step S22, a first electroplating step S23, a resist removing step S24, a seed layer removing step S25, and a second electroplating step S26. Resist forming step S22 is performed after seed layer forming step S21. First electroplating step S23 is performed after resist forming step S22. Resist removing step S24 is performed after first electroplating step S23. Seed layer removing step S25 is performed after resist removing step S24. Second electroplating step S26 is performed after seed layer removing step S25.

Figure 5:
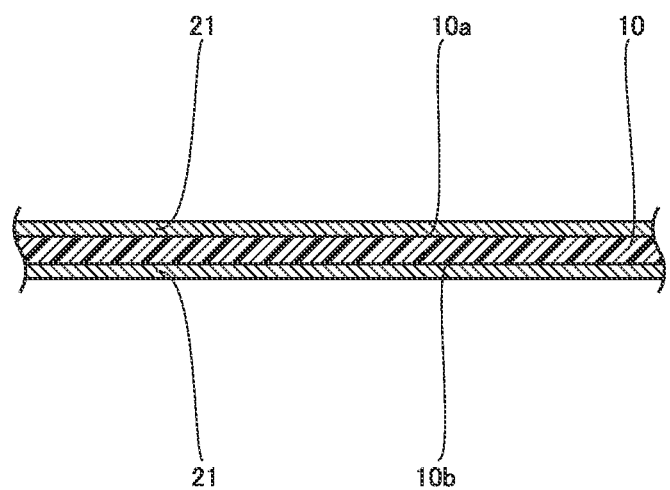
FIG. 5 is a cross sectional view of a base film 10 after a seed layer forming step S21 is performed.

FIG. 5 is a cross sectional view of base film 10 after seed layer forming step S21 is performed. As shown in FIG. 5, in seed layer forming step S21, seed layer 21 is formed. Seed layer 21 is formed by sequentially performing sputtering and electroless plating onto each of the main surfaces (first main surface 10a and second main surface 10b) of base film 10.

Figure 6:
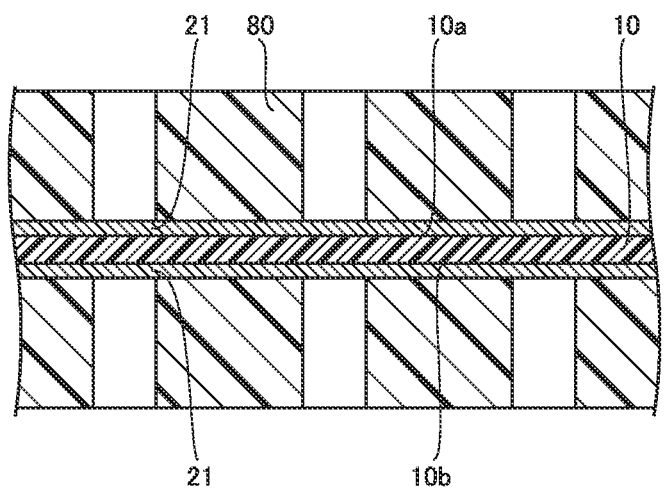
FIG. 6 is a cross sectional view of base film 10 after a resist forming step S22 is performed.
Figure 7:
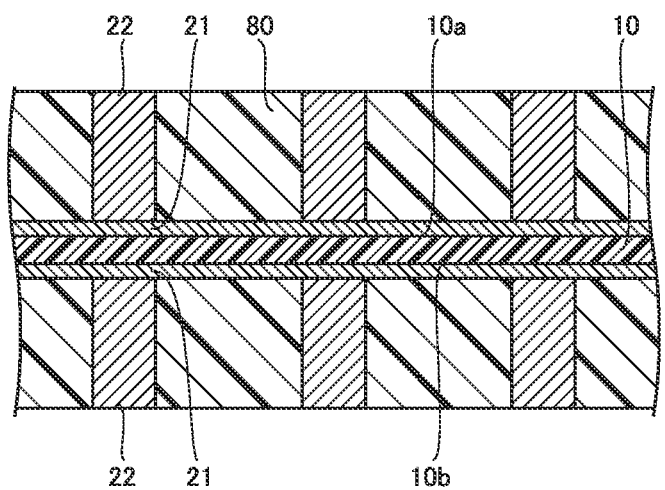
FIG. 7 is a cross sectional view of base film 10 after a first electroplating step S23 is performed.

FIG. 6 is a cross sectional view of base film 10 after resist forming step S22 is performed. As shown in FIG. 6, in resist forming step S22 a resist 80 is formed. Resist 80 is formed by applying a photosensitive organic material onto seed layer 21, exposing the applied photosensitive organic material to light, developing it, and performing patterning. Resist 80 is provided with an opening. Seed layer 21 is exposed from the opening of resist 80. FIG. 7 is a cross sectional view of base film 10 after first electroplating step S23 is performed. As shown in FIG. 7, in first electroplating step S23, first electroplating layer 22 is formed. First electroplating layer 22 is formed by feeding current to seed layer 21 so as to perform electroplating onto seed layer 21 exposed from the opening of resist 80.

Figure 8:
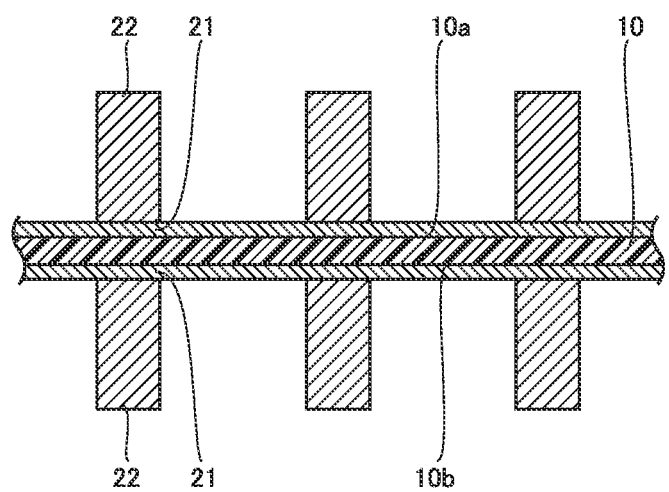
FIG. 8 is a cross sectional view of base film 10 after a resist removing step S24 is performed.

FIG. 8 is a cross sectional view of base film 10 after resist removing step S24 is performed. As shown in FIG. 8, in resist removing step S24, resist 80 is removed from seed layer 21. As a result of the removal of resist 80, seed layer 21 is exposed between portions of first electroplating layer 22.

Figure 9:
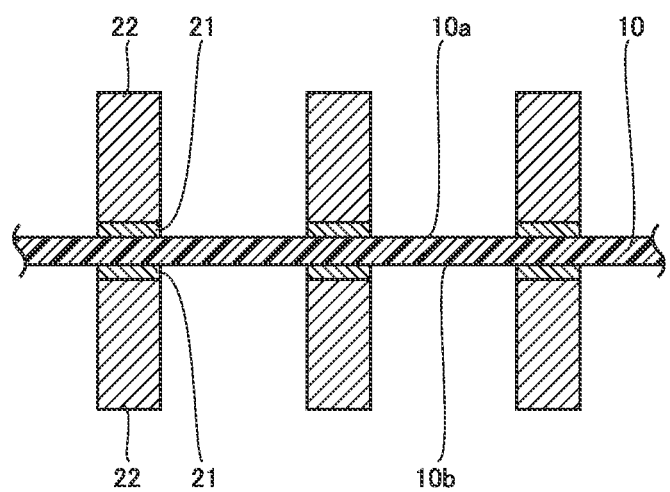
FIG. 9 is a cross sectional view of base film 10 after a seed layer removing step S25 is performed.

FIG. 9 is a cross sectional view of base film 10 after seed layer removing step S25 is performed. As shown in FIG. 9, in seed layer removing step S25, seed layer 21 exposed between the portions of first electroplating layer 22 is removed. The removal of seed layer 21 exposed between the portions of first electroplating layer 22 is performed by etching.

The etching is performed by supplying an etchant between the portions of first electroplating layer 22. The etchant is selected such that a rate of etching is determined by a reaction between a reactive species in the etchant and the etching target, rather than diffusion of the reactive species in the etchant to the vicinity of the etching target.

More specifically, the following etchant is used as the etchant: an etchant having a dissolution reaction rate of 0.5 μm/min or less with respect to the material (i.e., copper) of each of the second layer of seed layer 21 and first electroplating layer 22. A specific example of such an etchant is a sulfuric acid/hydrogen peroxide aqueous solution.

It should be noted that after the etching of the second layer of seed layer 21 is completed, the etchant is changed. The etchant is changed to an etchant having a high selectivity with respect to the material (i.e., nickel-chromium alloy) of the first layer of seed layer 21. Therefore, etching of first electroplating layer 22 is less likely to proceed after the changing of the etchant.

In second electroplating step S26, second electroplating layer 23 is formed. Second electroplating layer 23 is formed by electroplating. Current feeding in the electroplating in second electroplating step S26 is performed via seed layer 21 and first electroplating layer 22 at portions to be first plating lead 60 and second plating lead 70 after second electroplating step S26. In the manner described above, wirings 20 (first wiring 30, second wiring 40, and third wiring 50) each having the structure shown in FIGS. 1, 2, and 3 are formed.

Each of seed layer 21 and first electroplating layer 22 included in each of first plating lead 60 and second plating lead 70 extends to a feeding terminal located at an end portion of base film 10 before being cut into individual pieces. After second electroplating step S26 is performed, base film 10 is cut into individual pieces. Therefore, each of first plating lead 60 and second plating lead 70 extends to reach the end of base film 10 after being cut into individual pieces.

Effects of Printed Wiring Board According to Embodiment

Effects of printed wiring board 100 will be described below.

Third position P3 is located away from the current feeding position in second electroplating step S26 with respect to first position P1. Therefore, thickness T at third position P3 is likely to be smaller than thickness T at first position P1, with the result that the cross sectional area of wiring 20 at third position P3 is likely to be smaller than the cross sectional area of wiring 20 at first position P1.

According to diligent study by the present inventors, in order to attain a small difference between thickness T of the portion of wiring 20 close to the current feeding position and thickness T of the portion of wiring 20 away from the current feeding position, it is effective to decrease a current density of a current flowing through seed layer 21 and first electroplating layer 22 in second electroplating step S26. However, when the current density of the current flowing through seed layer 21 and first electroplating layer 22 is decreased in second electroplating step S26, a rate of formation of second electroplating layer 23 is decreased, thus resulting in an increased time required for second electroplating step S26.

In seed layer removing step S25, first electroplating layer 22 is also partially removed when removing the second layer of seed layer 21. Since second electroplating layer 23 is formed to compensate for first electroplating layer 22 having been thinned in seed layer removing step S25, second electroplating layer 23 does not need to be formed to be thick when an amount of removal of first electroplating layer 22 in seed layer removing step S25 is small.

In seed layer removing step S25, the etchant is less likely to be supplied between the portions of first electroplating layer 22. Therefore, when an etchant having a high dissolution reaction rate with respect to the material of seed layer 21 (i.e., an etchant with a rate of etching determined by diffusion of a reactive species in the etchant to the vicinity of the etching target) is used for the etching in seed layer removing step S25, variation in etching of seed layer 21 becomes large. As a result, an amount of etching needs to be increased to securely remove seed layer 21, with the result that first electroplating layer 22 becomes thin.

However, when an etchant having a low dissolution reaction rate with respect to the material of seed layer 21 is used for etching in seed layer removing step S25 (i.e., the rate of etching in seed layer removing step S25 is determined by a reaction between the reactive species in the etchant and the etching target), variation in etching of seed layer 21 is less likely to occur even though the etchant is less likely to be supplied between the portions of first electroplating layer 22.

As a result, in printed wiring board 100, first electroplating layer 22 is suppressed from being excessively etched in seed layer removing step S25, thereby maintaining the thickness of first electroplating layer 22. Therefore, in printed wiring board 100, it is not necessary to form a thick second electroplating layer 23, and the current density of the current flowing through seed layer 21 and first electroplating layer 22 can be decreased without increasing the time required for second electroplating step S26. In this way, in printed wiring board 100, the difference can be small between the cross sectional area of the portion of wiring 20 close to the current feeding position and the cross sectional area of the portion of wiring 20 away from the current feeding position.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

100: printed wiring board; 10: base film; 10a: first main surface; 10b: second main surface; 10c, 10d: through hole; 20: wiring; 21: seed layer; 22: first electroplating layer; 23: second electroplating layer; 30: first wiring; 30a: first end; 30b: second end; 31: terminal; 32: land; 33: coil; 40: second wiring; 40a: first end; 40b: second end; 41: terminal; 42: land; 50: third wiring; 50a: first end; 50b: second end; 51, 52: land; 53: coil; 60: first plating lead; 70: second plating lead; 80: resist; P1: first position; P2: second position; P3: third position; S1: preparing step; S2: wiring forming step; S21: seed layer forming step; S22: resist forming step; S23: first electroplating step; S24: resist removing step; S25: seed layer removing step; S26: second electroplating step; T: thickness.

The invention claimed is:

1. A printed wiring board comprising:
a base film having a first main surface and a second main surface opposite the first main surface;
a wiring disposed on the first main surface and disposed on the second main surface;
a first plating lead connected to a first position of the wiring; and
a second plating lead connected to a second position of the wiring, wherein
a cross sectional area of the wiring at a third position of the wiring is 95% or more of a cross sectional area of the wiring at the first position, the third position being an intermediate position between the first position and the second position,
wherein the wiring has at least one coil formed by winding the wiring in a form of a spiral on the first main surface;
wherein a through hole extends through the base film from the first main surface to the second main surface, wherein the wiring disposed on the first main surface is electrically connected to the wiring disposed on the second main surface by a conductor disposed on an inner wall surface of the through hole, wherein the through hole is located within the at least one coil;
wherein
the wiring has a seed layer disposed on the main surface, a first electroplating layer disposed on the seed layer, and a second electroplating layer covering the seed layer and the first electroplating layer, and
a thickness of the second electroplating layer at the third position is 8 μm or less;
wherein each of an end of the first plating lead opposite to the wiring and an end of the second plating lead opposite to the wiring reaches an end of the base film, wherein a first terminal is provided between the first plating lead and the first position of the wiring to connect the first plating lead to the first position of the wiring, wherein a second terminal is provided between the second plating lead and the second position of the wiring to connect the second plating lead to the second position of the wiring.

2. The printed wiring board according to claim 1, wherein an electric resistance value of the first plating lead between the first position and an end of the first plating lead opposite to the wiring is 1Ω or less, and an electric resistance value of the wiring and the first plating lead between the third position and the end of the first plating lead opposite to the wiring is 5Ω or more and 6Ω or less.

* * * * *